(12) United States Patent
Boyd et al.

(10) Patent No.: US 7,273,800 B2
(45) Date of Patent: Sep. 25, 2007

(54) HETERO-INTEGRATED STRAINED SILICON N- AND P-MOSFETS

(75) Inventors: Diane C. Boyd, LaGrangeville, NY (US); Juan Cai, Freemont, CA (US); Kevin K. Chan, Staten Island, NY (US); Patricia M. Mooney, Mount Kisco, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 10/978,715

(22) Filed: Nov. 1, 2004

(65) Prior Publication Data
US 2006/0091377 A1  May 4, 2006

(51) Int. Cl.
*H01L 21/265* (2006.01)
*H01L 21/00* (2006.01)
*H01L 21/84* (2006.01)
(52) U.S. Cl. .................. 438/522; 438/520; 438/149; 438/938
(58) Field of Classification Search ............... 438/938, 438/520, 522, 149
See application file for complete search history.

(56) References Cited

U.S. PATENT DOCUMENTS

| 6,562,703 | B1* | 5/2003 | Maa et al. | 438/518 |
| 6,593,625 | B2* | 7/2003 | Christiansen et al. | 257/347 |
| 6,709,903 | B2* | 3/2004 | Christiansen et al. | 438/149 |
| 2003/0127696 | A1* | 7/2003 | Lee | 257/384 |
| 2004/0087119 | A1* | 5/2004 | Maa et al. | 438/518 |
| 2004/0214407 | A1* | 10/2004 | Westhoff et al. | 438/459 |

* cited by examiner

*Primary Examiner*—Shouxiang Hu
(74) *Attorney, Agent, or Firm*—Scully, Scott, Murphy & Presser, PC; Ido Tuchman, Esq.

(57) ABSTRACT

The present invention provides semiconductor structures and a method of fabricating such structures for application of MOSFET devices. The semiconductor structures are fabricated in such a way so that the layer structure in the regions of the wafer where n-MOSFETs are fabricated is different from the layer structure in regions of the wafers where p-MOSFETs are fabricated. The structures are fabricated by first forming a damaged region with a surface of a Si-containing substrate by ion implanting of a light atom such as He. A strained SiGe alloy is then formed on the Si-containing substrate containing the damaged region. An annealing step is then employed to cause substantial relaxation of the strained SiGe alloy via a defect initiated strain relaxation. Next, a strained semiconductor cap such as strained Si is formed on the relaxed SiGe alloy.

28 Claims, 7 Drawing Sheets

HETERO-INTEGRATED STRAINED SILICON N- AND P-MOSFETS

FIELD OF THE INVENTION

The present invention relates to semiconductor structures and to methods of fabricating such structures for application for n- and p-metal oxide semiconductor field effect transistor (MOSFET) devices. More particularly, these semiconductor structures are fabricated in such a way so that the layer structure in the regions of the wafer where n-MOSFETs are fabricated is different from the layer structure in regions of the wafers where p-MOSFETs are fabricated. The present invention is also directed to a method for producing structures for the n-MOSFET including a Si-containing layer under biaxial tensile strain, which is the active region of the n-MOSFET, thus enhancing the device performance compared to a similar n-MOSFET fabricated on a standard bulk Si or Si-on-insulator (SOI) substrate.

BACKGROUND OF THE INVENTION

It is now well established that the performance of n-MOSFETs fabricated in a Si-containing layer under biaxial tensile strain is enhanced compared to that of devices of comparable size fabricated in unstrained Si-containing, e.g., either in bulk Si or in SOI substrates. The magnitude of the n-MOSFET performance enhancement increases with increasing biaxial tensile strain in the Si. This finding is reported, for example, in K. Rim, et al., 2002 Symposium on VLSI Technology Digest of Technical Papers, 98 (2002).

It has also been demonstrated that the performance of p-MOSFETs is degraded compared to that of the same size device fabricated in bulk Si or SOI for values of the biaxial tensile strain less than about 1%. This is illustrated in FIGS. 1A and 1B; FIG. 1A provides data for electron mobility, while FIG. 1B provides data for hole mobility.

However, for values of biaxial tensile strain greater than about 1%, the performance of the p-MOSFET is significantly enhanced compared to that of p-MOSFETS of similar size fabricated in an unstrained Si-containing material. Thus, a method to produce a Si-containing material under biaxial tensile strain of less than about 1% only in regions of the wafer where the n-MOSFETs will be fabricated and not in regions of the wafer where the p-MOSFETs will be fabricated is needed.

Several different methods to produce a Si-containing layer under biaxial tensile strain over the entire wafer surface have been implemented. These methods typically employ a strain-relaxed SiGe buffer layer that serves as a "virtual substrate" for the epitaxial growth of a pseudomorphic Si-containing layer under biaxial tensile strain. The degree of biaxial tensile strain in the Si-containing layer is determined by the alloy composition and degree of strain relaxation of the SiGe buffer layer. Because strain relaxation of the SiGe buffer layer typically occurs by the introduction of 60° misfit dislocations, great care must be taken when fabricating the SiGe buffer layer to minimize the threading arms associated with these misfit dislocations. The threading dislocations extend to the wafer surface where the devices are, and thus may degrade device performance.

The most commonly used SiGe virtual substrate consists of a very thick (several μm) SiGe layer in which the alloy composition is increased continuously, or in steps, up to the required value, followed by another very thick (several μm) layer of the desired uniform alloy composition. Such thick graded buffer layers have been shown to have a low density of threading dislocations and are thus potentially suitable for CMOS applications. See, for example, F. K. LeGoues, et al., J. Appl. Phys. 71, 4230 (1992); U.S. Pat. No. 5,659,187 to F. K. LeGoues, et al.; E. A. Fitzgerald, et al., Appl. Phys. Lett. 59, 811 (1991); and G. Kissinger, et al., Appl. Phys. Let. 66, 2083 (1995).

An alternative method of fabricating a strain-relaxed SiGe buffer layer using ion implantation of He or other atoms to introduce dislocation nucleation sources in a controlled manner has also been implemented. This particular approach of using He ion implantation is described, for example, in S. H. Christiansen, et al. Mat. Res. Soc. Symp. Proc. 686, 27-32 (2002); M. Luysberg, et al., J. Appl. Phys. 92, 4290 (2002); J. Cai, et al., J. Appl. Phys. 95, 5347 (2004) and Mat. Res. Soc. Symp. Proc. 809, B8.2 (2004); D. Buca, et al., Mat. Res. Soc. Symp. Proc. 809, B1.6 (2004) and references therein; U.S. Pat. Nos. 6,593,625 and 6,709,903 to S. H. Christiansen, et al.; and U.S. application Ser. No. 10/299,880, filed Nov. 19, 2002.

In the ion implantation approach, a thin pseudomorphic or nearly pseudomorphic SiGe layer under biaxial compressive strain is first grown on a Si-containing substrate. He or other atoms are then implanted into this SiGe/Si-containing heterostructure. The implantation energy is chosen so that the projected range of the implanted He lies about 200 nm below the SiGe/Si interface. The wafer is then annealed in a furnace in a He or a $N_2$ atmosphere at temperatures above 700° C. for at least 10 minutes. He-induced bubbles or platelets are formed during annealing. These defects are nucleation sources for misfit dislocations that relieve about 70-80% of the compressive strain, depending on the thickness of the SiGe layer. The threading dislocation density in these SiGe buffer layers was found to correlate with the amount of He implanted into the SiGe layer; see J. Cai, et al., J. Appl. Phys. 95, 5347 (2004). For a given He dose, there is a minimum density for thinner SiGe layers and when the implanted atoms are relatively deep, but still close enough to the surface, that the SiGe layer relaxes (see FIG. 2). The degree of strain relaxation increases with the thickness of the SiGe layer indicating that the SiGe layer should be as thick as possible for each alloy composition.

Little or no strain relaxation occurs in wafers that are not implanted and, which were annealed under the same conditions as the implanted wafers (see FIGS. 3A and 3B). Finally, the device structure is completed by the epitaxial growth of an additional SiGe layer of the same alloy composition as the relaxed SiGe buffer layer or with the alloy composition chosen so that the in-plane lattice parameter is matched to that of the 70-80% strain-relaxed SiGe layer followed by a thin pseudomorphic Si-containing layer which is under biaxial tensile strain. The thickness of the resulting implanted and annealed SiGe buffer layer may be as little as 10% of the thickness of the graded SiGe buffer layer and has a comparable threading dislocation density and a smoother surface. This prior art method also offers the advantage of lowering the cost of device fabrication.

However, in view of the degraded performance of p-MOSFETs fabricated in Si-containing layers under biaxial tensile strain of <1%, further improvements are needed. Specifically, a new and improved method for fabricating structures including a strain-relaxed SiGe virtual substrate and a Si-containing layer under biaxial tensile strain only in areas of the wafer where the n-MOSFETS are to be fabricated and a different layer structure in areas of the wafers where the p-MOSFETs are to be fabricated is desirable.

SUMMARY OF THE INVENTION

The present invention relates to a method of obtaining a layered structure for application as a "virtual substrate" for strained layered devices such as field effect transistors (FETs) by employing ion implantation of He or other atoms to create defects that serve as dislocation nucleation sources. In order to avoid implanting He or other atoms into a SiGe layer, the inventive method provides a processing sequence in which He or another atom is first implanted into a Si-containing substrate with the implantation energy chosen so that the projected range of the He atoms is typically about 200 nm below the Si-containing substrate surface.

Subsequently, a strictly pseudomorphic or nearly pseudomorphic SiGe alloy layer is grown on the wafer at a temperature low enough that the He or other implanted atoms do not diffuse out from the substrate during the growth of this layer. A growth method known as rapid thermal chemical vapor deposition (RTCVD) in which the growth rate of the SiGe layer is relatively fast compared to other low temperature growth methods such as UHVCVD or MBE is ideal for the inventive process since out-diffusion of He or other implanted atoms is minimized. After the growth of the SiGe layer, the wafer is typically annealed in-situ in the growth chamber. Again the RTCVD method is ideally suited for the inventive process since in this epitaxial growth method the substrates are heated by arc lamps, thus allowing the substrate temperature to be changed very rapidly. After a suitable annealing procedure, which will depend on the implanted atoms, the substrate temperature is reduced to 600° C. and a pseudomorphic Si layer under biaxial tensile strain is grown.

The inventive process has clear advantages over previous methods, including those described in U.S. Pat. No. 6,709,903. For instance, by changing the order of the SiGe layer growth and the implantation of He or other atom species, the number of process steps is reduced from 4 to 2 steps, where a step is defined as the use of a single tool. Furthermore, by doing the growth of the SiGe layer, the annealing and the subsequent semiconductor cap growth sequentially in a single tool, the cleanliness of the substrate surface is maintained and substrate cleaning steps needed after ion implantation and after annealing in a furnace in the previous method can be eliminated.

Thus, the inventive method considerably reduces the cost of fabricating these strained semiconductor substrates. In a first embodiment of the present invention, the entire wafer has the same layered structure. Thus, it is desirable that the biaxial compressive strain in the semiconductor cap be about 1% or greater, in order that the p-MOSFET performance is not degraded.

A further advantage of the inventive process is that in the case of a SiGe layer with low mismatch strain, i.e., less than about 1%, the degradation in p-MOSFET performance can be avoided by implanting He or other atoms only in the regions where the n-MOSFETS will be fabricated. Provided the SiGe layer is thin enough, negligible strain relaxation of the SiGe layer occurs in areas of the wafer that are not implanted. Thus in those areas the in-plane lattice parameter of the semiconductor cap is the same as that of the underlying unstrained Si-containing substrate and p-MOSFETs fabricated in these areas will have the same performance as those fabricated in a bulk Si or SOI substrate. Thus in this second embodiment of the present invention, wherein only areas where n-MOSFET will be fabricated are implanted, the inventive process not only reduces fabrication costs but also produces n-MOSFETs with enhanced performance while avoiding degradation of the p-MOSFETs.

However, it is also known that the performance of p-MOSFETs fabricated in SiGe under biaxial compressive strain is enhanced compared to p-MOSFETs of comparable dimension fabricated in Si. Therefore, in a third embodiment of this invention, the semiconductor cap is removed from the areas of the substrates that were not implanted and the p-MOSFET is fabricated in the compressively strained SiGe layer. Thus, p-MOSFETs with enhanced performance compared to those fabricated in unstrained Si are obtained in addition to n-MOSFETs with enhanced performance fabricated in a semiconducting material under biaxial tensile strain.

In a fourth embodiment of this invention, implantation of He or other atoms is done only in areas of the Si-containing substrate where the n-MOSFETs are to be fabricated and the strictly pseudomorphic or nearly pseudomorphic SiGe layer is grown selectively only in those same areas and not in other areas where the p-MOSFETs or other circuit components are to be fabricated. The embodiments described previously are restricted to SiGe layers that are sufficiently thin that no strain relaxation occurs in areas of the wafer that were not implanted. The fourth embodiment of the present invention permits the use of a thicker SiGe layer to obtain increased strain relaxation of the SiGe and thus a higher degree of biaxial tensile strain in the semiconductor cap. Because the SiGe layer is relatively thin (<0.5 μm), this embodiment of the present invention is not expected to cause serious problems for later device fabrication steps.

It is also proposed that the areas of the substrate to be implanted with He or other atoms may be defined using a mask level that is used for device isolation. A blocking mask can be used to cover the areas of the wafer containing p-MOSFETs or other devices that are not to be implanted. In this way either all or only selected n-MOSFETs will be strained semiconductor devices. This same mask would also be used for the subsequent fabrication steps described above.

In broad terms, the method of the present invention includes the steps of:

forming at least one damaged region within a surface of a Si-containing substrate;

forming a strained SiGe alloy on at least a portion of said surface of said Si-containing substrate;

annealing at a temperature of about 700° C. or above to cause substantial relaxation of the strained SiGe alloy via defect initiated strain relaxation; and forming a strained semiconductor cap on said strained SiGe alloy that has been substantially relaxed.

In addition to the method described above, the present invention also is related to the semiconductor structure that is formed by the method. In broad terms, the semiconductor structure of the present invention comprises:

a Si-containing substrate having platelets and dislocation loops present therein;

at least one region of substantially relaxed SiGe located on a portion of said Si-containing substrate, said substantially relaxed SiGe is positioned atop said platelets and said dislocation loops; and at least one region of a strained semiconductor located on said substantially relaxed SiGe.

BRIEF DESCRIPTION OF THE DRAWINGS

FIG. 3A shows the strain relaxation of $Si_{1-x}Ge_x$ layers, x=0.16 (●○) and x=0.20 (■□), grown by UHVCVD on 200 mm wafers, and FIG. 3B shows the strain relaxation of $Si_{0.8}Ge_{0.2}$ layers grown in three different reactors: UHVCVD-200 (■□); RTCVD-200 (●○); and RTCVD-300 (▲△). Samples were annealed at 800° C. or 850° C. for at least 10 minutes. Open symbols are areas of the wafer that were not implanted. Solid symbols are areas that were implanted with $1×10^{16}$ $cm^{-2}$ helium at a depth of 140-200 nm below the SiGe/Si interface. The error in the strain relaxation measured by XRD is approximately ±3%. Data is reproduced from Juan Cai, et al., JAP.

DETAILED DESCRIPTION OF THE INVENTION

The present invention, which provides virtual substrates and a method of fabricating the same, will now be described in greater detail by referring to the following discussion, which makes reference to FIGS. 4-7. It is noted that the drawings of the present application are provided for illustrative purposes and thus they are not drawn to scale.

FIGS. 4A-4D are cross sectional views depicting a virtual substrate through various processing steps of a first embodiment of the present invention. In broad terms, the first embodiment includes implanting ions of He or other atoms into a single crystal Si-containing substrate to form a damaged region within the substrate, forming a strained SiGe alloy layer on a surface of the Si-containing substrate, annealing to cause substantial relaxation of the strained SiGe alloy layer and formation of defects such as platelets and dislocation loops within the previous damaged region, and forming a strained semiconductor layer atop of the now substantially relaxed SiGe alloy layer. The first embodiment of the present invention is now described in greater detail.

Figure 1A:
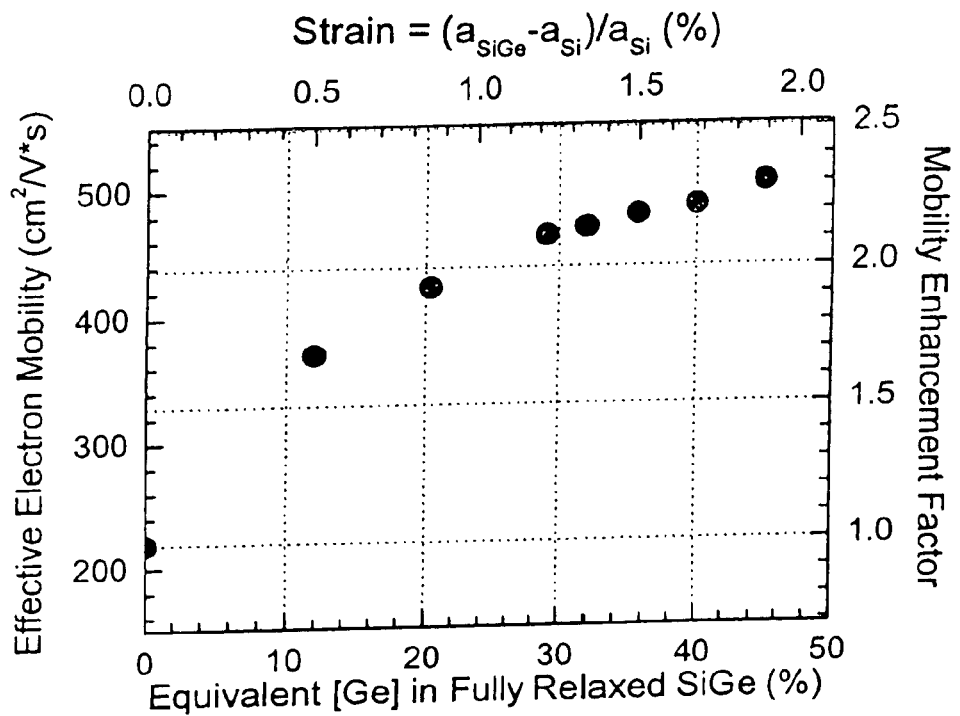
FIGS. 1A and 1B are plots showing the effective electron and hole mobilities, respectively, in n- and p-MOSFETs as a function of the strain in the Si-containing layer and the equivalent composition of the SiGe "virtual substrate" assuming 100% strain relaxation of the SiGe buffer layer.
Figure 1B:
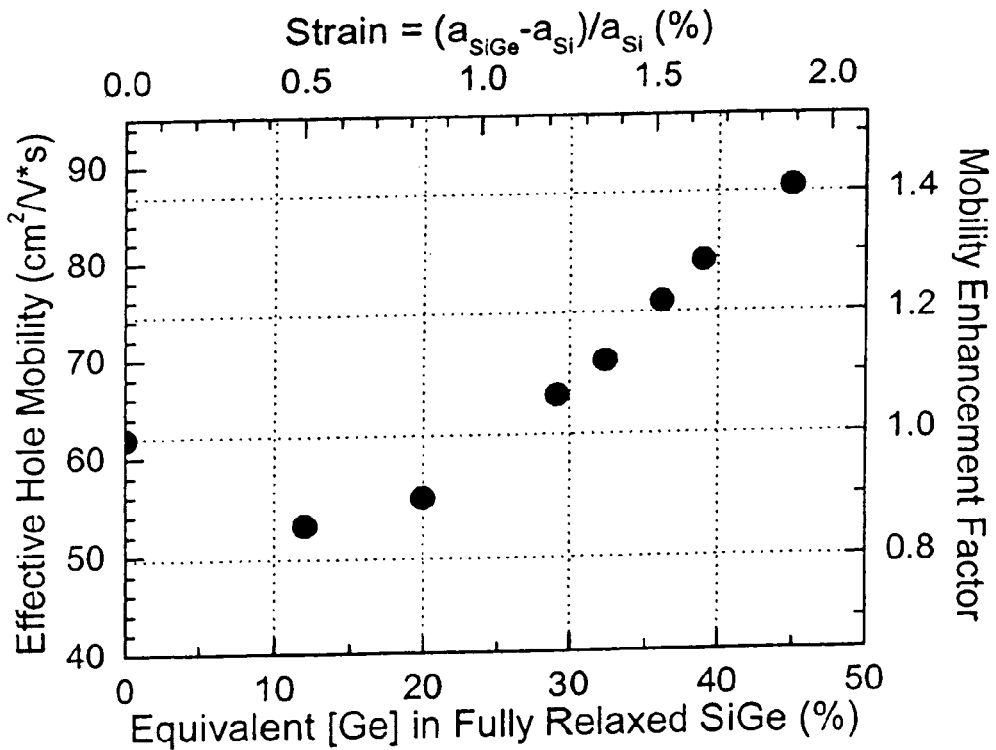
Figure 2:
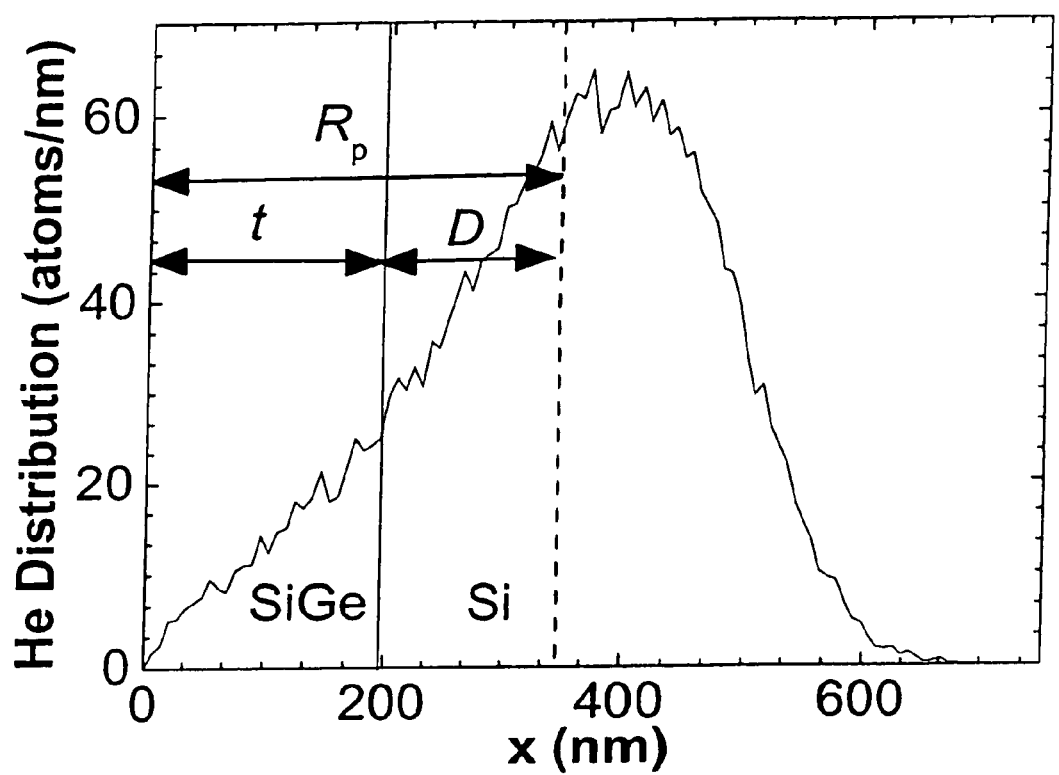
FIG. 2 is a simulated helium profile for 38 keV $He^+$ implanted into a 196 nm-thick $Si_{0.7}Ge_{0.3}$/Si structure. Rp is the projected range of He, t is the SiGe layer thickness, and D is implantation depth with respect to the SiGe/Si interface. The simulation software was SRIM2000. The total number of He atoms used in simulation is 20000.
Figure 3A:
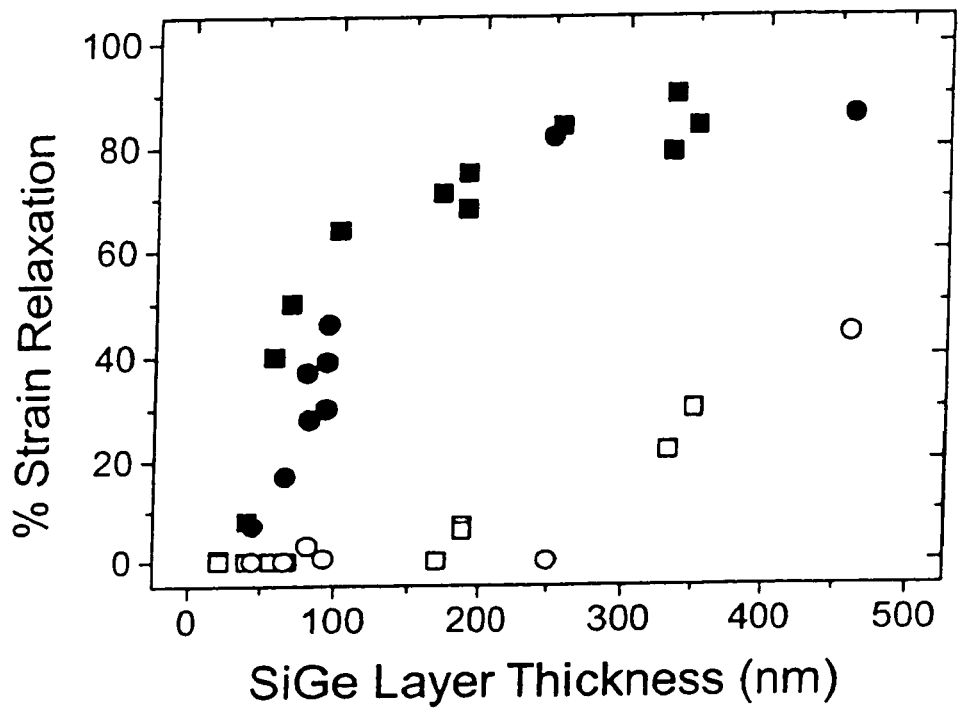
FIGS. 3A-3B are plots showing the % strained relaxation vs. SiGe layer thickness. Specifically.
Figure 3B:
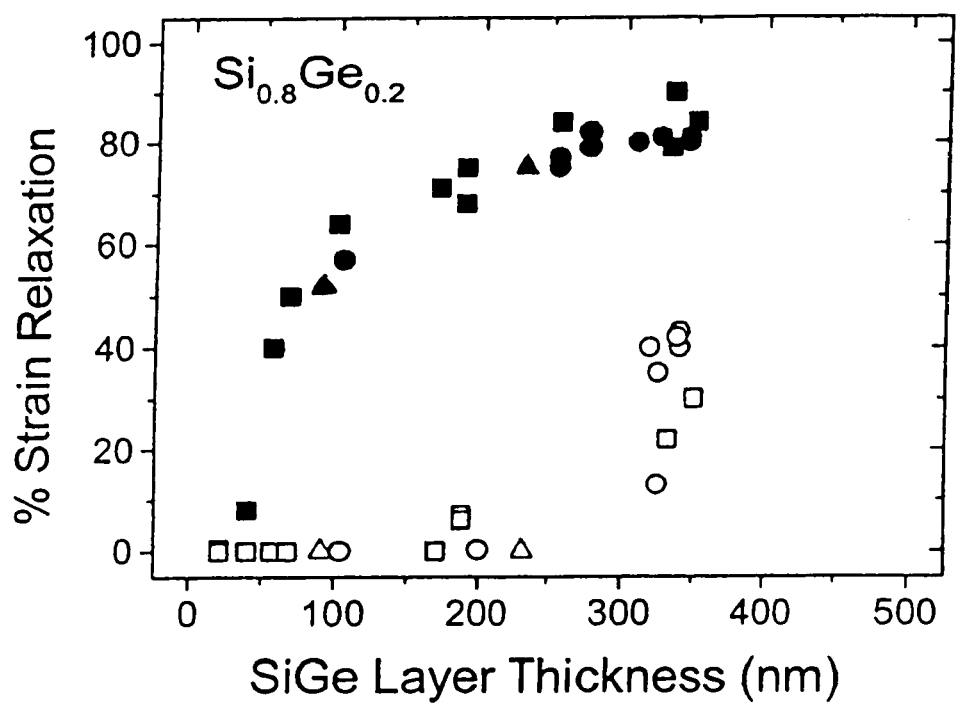
Figure 4A:
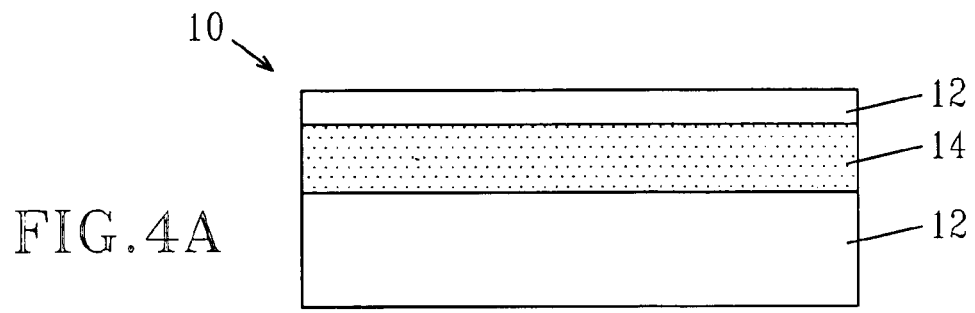
FIGS. 4A-4D are pictorial representations (through cross sectional views) illustrating the basic processing steps employed in a first embodiment of the present invention.

FIG. 4A illustrates a structure 10 that includes a single crystal Si-containing substrate 12 having a damaged region 14 located beneath the surface of the Si-containing substrate 12. The term "Si-containing" as used throughout the present application denotes any semiconductor material that includes silicon. Illustratively, the Si-containing semiconductor material can comprise Si, SiGe, SiC, SiGeC, a silicon-on-insulator (SOI), a silicon germanium-on-insulator (SGOI) or other like material.

The damaged region 14 is formed by implanting light atoms, such as helium (He), hydrogen (H), deuterium (D), boron (B), nitrogen (N) or mixtures thereof, into the Si-containing substrate 12. In one preferred embodiment, He is implanted into the single crystal Si-containing substrate 12. The implanted ions may be implanted to any depth below the upper surface of the Si-containing substrate 12. Typically, the ions are implanted from about 90 nm to about 300 nm below the upper surface of the Si-containing substrate 12, with a projected range of 200 nm below the upper surface of the Si-containing substrate 12 being more typical.

Specifically, the damaged region 14 is formed by implanting at least one of the above mentioned atoms into the Si-containing substrate 12 at an ion dose from about $5×10^{15}$ to about $2×10^{16}$ $cm^{-2}$. More typically, the ion dose used in creating the damaged region 14 within the Si-containing substrate 12 is from about $7×10^{15}$ to about $1×10^{16}$ $cm^{-2}$.

The implanting step used in forming the damaged region 14 within the Si-containing substrate 12 may include a single implant step in which one of the above mentioned light atoms is used as the implanting species. It is also contemplated in the present invention to use multiple implant steps. For example, the present invention contemplates a first ion implant step in which a first light atom is implanted into the Si-containing substrate 12, followed by a second ion implant step in which a second light atom (that can be the same or different, preferably different, from the first light atom) is implanted into the Si-containing substrate 12. In such an embodiment, it is preferred that one of the implants includes at least a He ion implant step. When multiple ion implants are employed, the ions can be implanted to the same depth or at different depths (preferably within the ranges mentioned above) below the surface of the Si-containing substrate 12.

In the first embodiment of the present invention, the light atoms are implanted across the entire area, i.e., surface, of the Si-containing substrate 12. The ion implant can be performed utilizing standard ion implant tools that are well known to those skilled in the art.

Figure 4B:
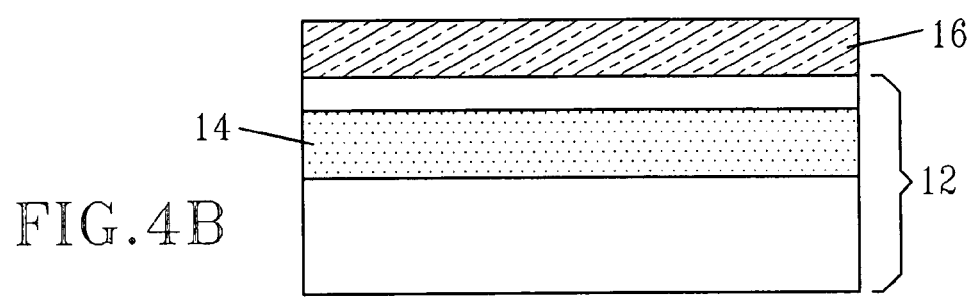

Next, and as shown in FIG. 4B, a strained SiGe alloy layer 16 is formed atop the surface of the Si-containing substrate 12 that includes the damaged region 14. By 'strained', it is meant that the SiGe alloy has a compressive or tensile stress associated therewith. The strained SiGe alloy layer is a nearly pseudomorphic or strictly pseudomorphic $Si_{1-x}Ge_x$ material in which x (the mole fraction of Ge) is uniform and is from about 0.01 to about less than 1, preferably x is from about 0.15 to about 0.40, or a graded composition in which x increases from 0 at the surface of the Si-containing substrate 12 to higher x values (typically ranging from about 0.01 to less than about 1) at the upper regions of the SiGe alloy layer 16.

The strained SiGe alloy 16 has a thickness that may vary depending upon the composition of the SiGe alloy layer 16 and the technique that is used in forming the same. Typically, the strained SiGe alloy layer 16 has a thickness from about 5 to about 500 nm, with a thickness from about 75 to about 250 nm being more typical.

The strained SiGe alloy layer 16 is formed utilizing any epitaxial growth process which is capable of forming such a layer atop a single crystal Si-containing substrate. Examples of various growth processes that can be used to deposit the strained SiGe alloy layer 16 atop the single crystal Si-containing substrate 12 containing the damaged region 14 include ultra-high vacuum chemical vapor deposition (UH- VCVD), rapid thermal chemical vapor deposition (RTCVD), CVD, molecular beam epitaxy, plasma enhanced chemical vapor deposition (PECVD), ion assisted deposition or chemical beam epitaxy. It is preferred, however, to employ RTCVD to grow the strained SiGe alloy layer 16 on the surface of the Si-containing substrate 12 that contains the damaged region 14. In RTCVD, the growth rate is relatively fast compared to other low temperature (on the order of about 600° C. or less) growth methods thereby minimizing the out-diffusion of the ions from the damaged region 14.

The structure shown in FIG. 4B is then subjected to an annealing step which is capable of substantially relaxing the strained SiGe alloy layer 16 by way of the formation of platelets and dislocation loops. The resultant structure formed after this annealing step has been performed is shown, for example, in FIG. 4C. In the illustrated structure of FIG. 4C, reference numeral 18 denotes the substantially relaxed SiGe alloy layer, reference numeral 20 denotes platelets or bubbles, and reference numeral 22 denotes dislocation loops or dislocation half loops. It is noted that the terms "platelets" and "bubbles can be interchangeably used in the present invention, while the terms "dislocation loops" and "dislocation half loops" can be interchangeable used. Specifically, the annealing is performed at a temperature above 700° C. in a non-oxidizing ambient. More typically, the annealing is performed at temperature within a range from about 750° to about 900° C. Various heating schemes including different ramp-up steps, soak cycles and cool down steps can be employed. A single ambient can be used throughout the entire process or different ambients, as desired, can be used during the annealing cycle.

The term "non-oxidizing" as used herein includes any ambient that does not include oxygen or a source of oxygen. Examples of such non-oxidizing ambients include, for instance, He, Ne, Ar, Xe, $H_2$, $N_2$ or mixtures thereof.

The anneal can be performed using a furnace anneal, a rapid thermal anneal, a laser anneal, a spike anneal or other related annealing processes that are capable of at least substantially relaxing a strained SiGe alloy layer via platelet and dislocation loop formation ('via defect initiated strain relaxation'). In one preferred embodiment, the annealing is performed using an arc lamp which allows the wafer temperature to be changed very rapidly. The anneal can be performed in the same reactor chamber that is used to grow layers 16 and 24, or it can be performed in a different reactor chamber than used to form layer 16 or layer 24. In a preferred embodiment, it is preferred that the annealing be preformed in-situ, i.e., in the same reactor chamber that was used to grow layer 16 and layer 24.

As indicated above, the annealing step causes substantial relaxation of the strained SiGe alloy layer. By "substantial relaxation" is meant a measured relaxation value of at least 60% or greater. Preferably, the strained SiGe alloy layer 16 after annealing has a measured relaxation value of greater than 85%. The resultant substantially relaxed SiGe alloy layer 18 has a very low number of defects (such as threading defects) present therein. That is, the substantially relaxed SiGe alloy layer 18 has a defect density of about 5E7 (i.e., $5 \times 10^7$) $cm^{-2}$ or less.

The annealing step, as mentioned above, causes platelets or bubbles 20 and dislocation loops or dislocation half loops 22 to form in the previous damaged region 14. Specifically, platelets or bubbles 20 are formed during annealing at a depth from about 100 to about 200 nm below the upper surface of the Si-containing substrate 12. The high strain in the region of the platelets or bubbles 20 results in the nucleation of dislocation half loops (i.e., dislocation loops 22) at the platelets or bubbles 20. The dislocation loops or half loops 22 glide to the interface between the substrate 12 and the strained SiGe alloy layer 16 where long misfit dislocation segments that relieve the lattice mismatch strain in layer 16 are formed.

It should be noted that the steps of forming a strained SiGe alloy layer and annealing can be repeated any number of times to provide a multilayered structure.

Figure 4C:
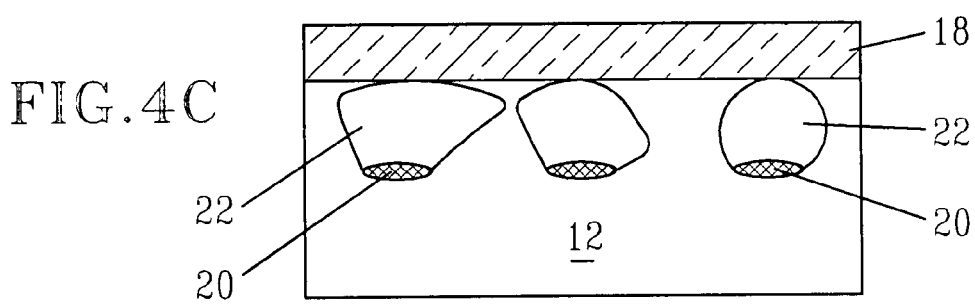
Figure 4D:
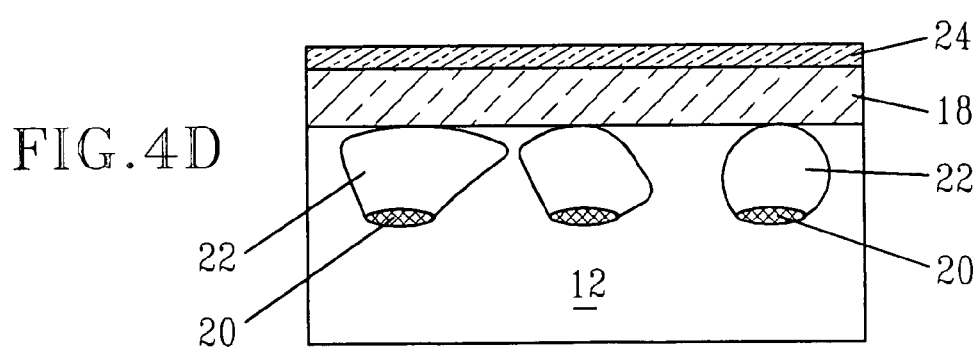

After annealing, a strained semiconductor cap 24 is formed atop the structure shown in FIG. 4C so as to provide the structure shown in FIG. 4D. The strained semiconductor cap 24 includes any type of semiconducting material such as, for example, Si, SiGe, Ge, SiC, SiGeC or multilayers thereof. Typically, the strained semiconductor cap 24 is Si.

The strained semiconductor cap 24 is formed utilizing any of the above mentioned epitaxial growth processes. It should be noted that the growth of layers 16 and 24 can occur in the same reactor chamber in which the vacuum is not broken between the deposition of the two layers. Alternatively, layers 16 and 24 can be formed in different reactor chambers.

The strained semiconductor cap 24 can be under either tensile or compressive strain. Typically, and in one embodiment a biaxial tensile strained semiconductor cap 24 having less than 1% strain is formed. In another embodiment, a biaxial tensile strained material having greater than 1% strain is formed. The thickness of the strained semiconductor cap 24 formed can vary depending on the type of semiconductor material and method used to deposit the same. Typically, the thickness of the as deposited strained semiconductor cap 24 is from about 10 to about 40 nm, with a thickness from about 15 to about 30 nm being even more typical.

The resultant structure shown in FIG. 4D includes blanket layers of relaxed SiGe alloy layer 18 and strained semiconductor cap 24 atop the Si-containing substrate 12 that includes platelets or bubbles 20 and dislocation loops or dislocation half loops 22.

FIGS. 5A-5D show a second embodiment of the present invention in which strained and unstrained areas of a semiconductor cap are formed atop relaxed and strained areas of a SiGe alloy layer. This second embodiment of the present invention is similar to the first embodiment except that the implant of the light atoms into the Si-containing substrate are done selectively to form discrete and isolated damaged regions with the Si-containing substrate.

Figure 5A:
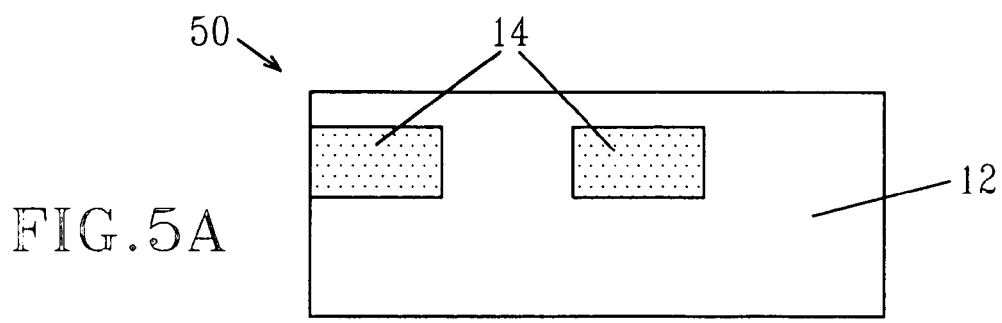
FIGS. 5A-5D are pictorial representations (though cross sectional views) illustrating the basic processing steps employed in a second embodiment of the present invention.

FIG. 5A illustrates the structure 50 that is formed after the selective ion implant step. As shown, discrete and isolated damaged regions 14 are formed within the Si-containing substrate 12. Although two discrete and isolated damaged regions are shown, the present invention works when as little as one, or more than two discrete and isolated damaged regions are formed within the Si-containing substrate 12.

Unlike the first embodiment in which a blanket ion implant step was used, the second embodiment implants the light atoms into the Si-containing substrate 12 utilizing a masked ion implantation process. The mask can be formed atop the Si-containing substrate 12 prior to implantation by lithography or alternatively a mask above the surface of the Si-containing substrate 12 can be used during the implant step itself. The type of light atoms and conditions used in the masked ion implantation step are the same as those described above in the first embodiment wherein a maskless, i.e., blanket, ion implant was performed.

Figure 5B:
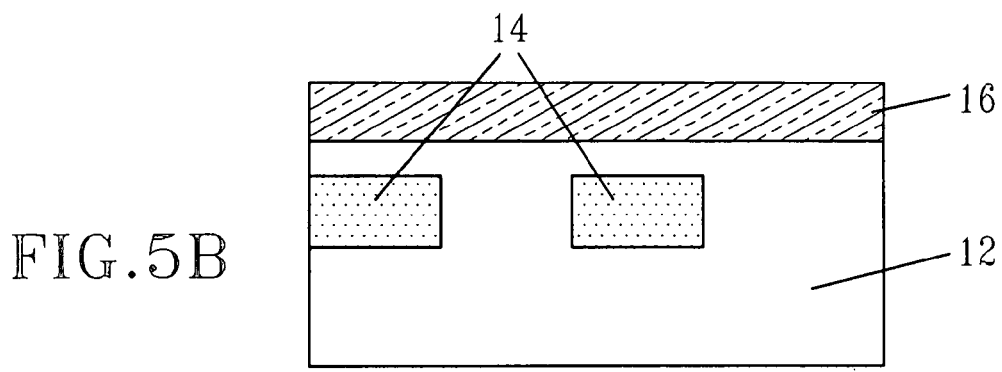

Next, and as shown in FIG. 5B, a strained SiGe alloy layer 16 is formed on the surface of the Si-containing substrate 12 that includes the discrete and isolated damaged regions 14.

The formation of the strained SiGe alloy layer 16 is performed as described above in the first embodiment of the present invention.

Figure 5C:
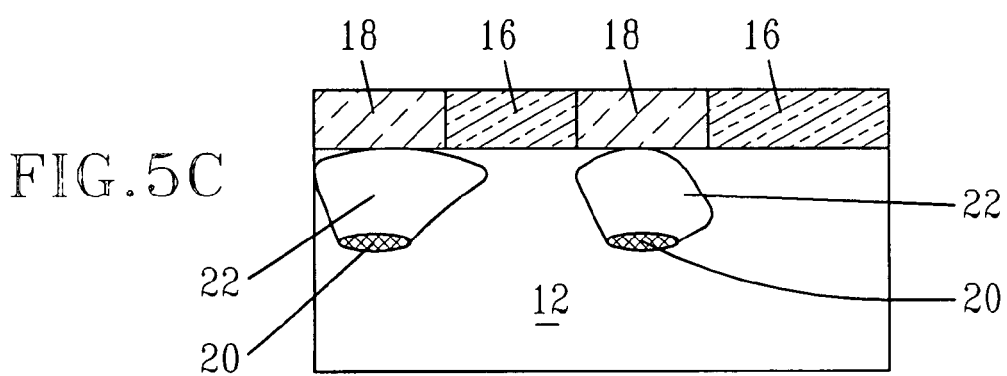

The annealing step described above is then performed, and the structure shown in FIG. 5C is obtained. As shown, during annealing areas of the strained SiGe alloy layer 16 (above the damaged regions) are substantially relaxed during the annealing, while other areas of the strained SiGe alloy layer (above portions of the substrate not containing any damaged region) remain unchanged after annealing. In FIG. 5C, reference numeral 18 denotes the substantially relaxed SiGe areas, while reference numeral 16 denotes the areas of the strained SiGe layer that remain strained after annealing. It is noted that the substantial relaxation of the strained SiGe alloy layer 16 occurs in regions of the layer that overlay the damaged region 14. As was the case in the first embodiment, platelets or bubbles 20 and dislocation loops or dislocation half loops 22 form during the anneal in the regions containing the damaged region which, in turn, cause strain relaxation of overlaying areas of the strained SiGe alloy layer 16.

Next, a semiconductor cap 52 is formed atop the structure including the SiGe layer that has substantially relaxed areas 18 and strained areas 16. The semiconductor cap 52 includes any of the semiconductor materials that where mentioned in connection with cap 24 of the first embodiment of the present invention. The semiconductor cap 52 is formed utilizing the same processing as that used to deposit the strained semiconductor layer 24. In this embodiment, the areas of the semiconductor cap 52 that are located above relaxed areas 18 are strained (labeled as 54 in FIG. 5D), while the areas of the semiconductor cap 52 that are located above the strained areas 16 are unstrained (labeled as 56 in FIG. 5D).

Figure 5D:
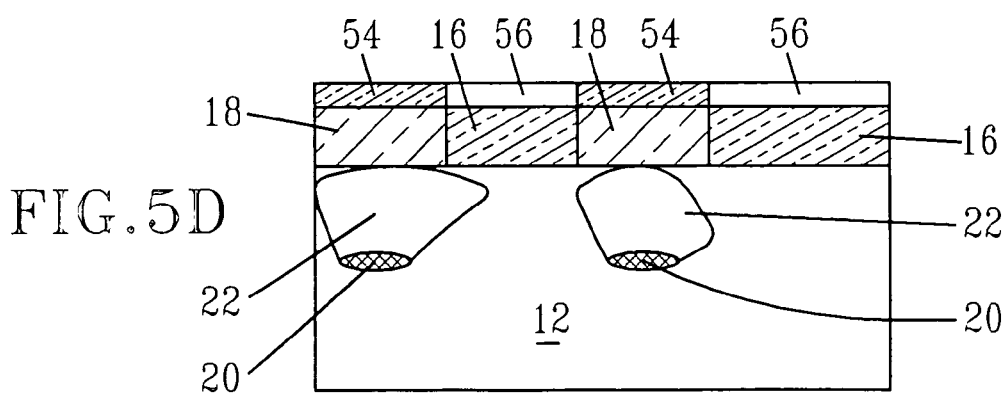
Figure 6:
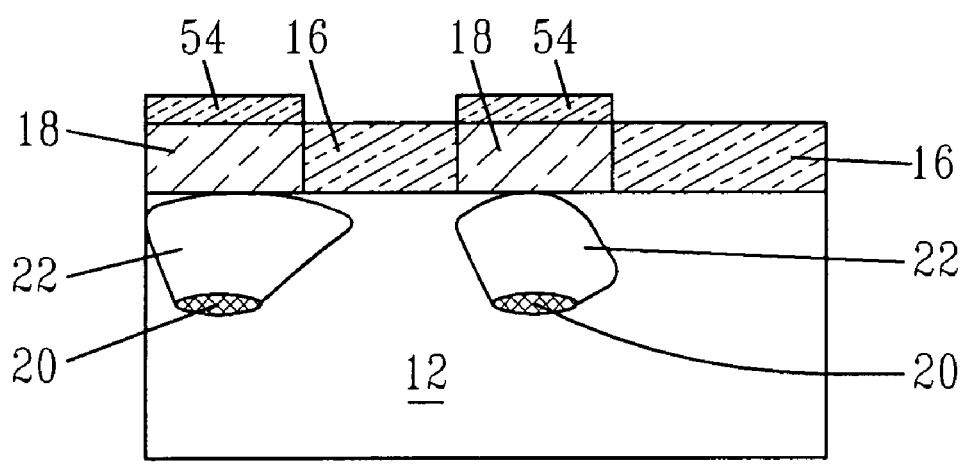
FIG. 6 is pictorial representation (through a cross sectional view) illustrating the structure of FIG. 5D after removing the unstrained areas of the semiconductor cap from atop the relaxed SiGe layer; this represents a third embodiment of the present invention.

The third embodiment of the present invention is identical to the second embodiment described above, except that the unstrained areas 56 are removed from the structure shown in FIG. 5D utilizing a selective etching process. Specifically, the selective etching process is performed by forming a patterned resist (not shown) atop the strained areas 54 of semiconductor cap 52 by deposition and lithography. The patterned resist protects the strained areas 54, while leaving the unstrained areas 56 exposed. The exposed unstrained areas 56 are then removed by a dry etching process such as reactive ion etching, ion beam etching, plasma etching or laser ablation. FIG. 6 shows the structure that is formed after this selective removal process.

Figure 7A:
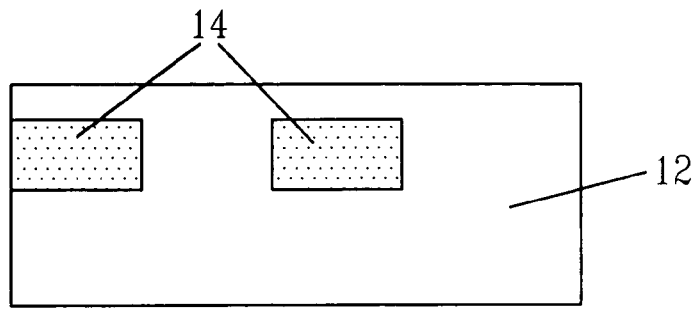
FIGS. 7A-7D are pictorial representations (through cross sectional views) illustrating the basic processing steps employed in a fourth embodiment of the present invention.

A fourth embodiment of the present invention is shown in FIGS. 7A-7D. This embodiment begins by providing the structure 50 shown in FIG. 7A. As shown, the structure 50 includes Si-containing substrate 12 having discrete and isolated damaged regions 14 located therein. The structure shown in FIG. 7A is the same as that shown in FIG. 5A; therefore the processing described above in regarding to FIG. 5A is applicable here for this embodiment of the present invention. Specifically, a masked ion implantation process is used to create the structure 50 shown in FIG. 7A.

Figure 7B:
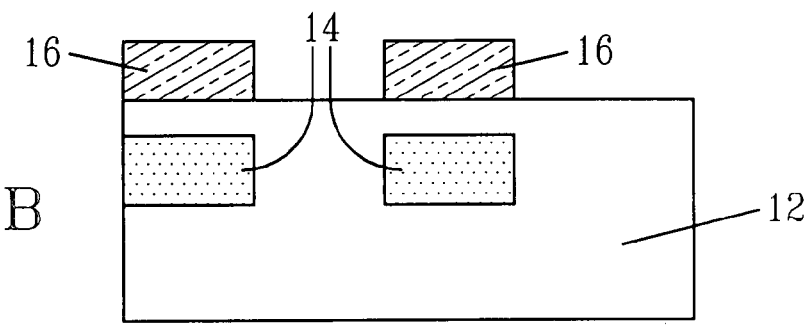

Next, and as shown in FIG. 7B, areas of strained SiGe alloy 16 are selectively grown atop of the Si-containing substrate 12 in those regions that lay above the discrete and isolated damaged regions 14. The selective growth of strained SiGe alloy 16 can be achieved by either utilizing the same or different patterned mask as that used in forming the discrete and isolated damaged regions 14 within Si-containing substrate 12. The growth of the SiGe alloy layer is achieved utilizing one of the growth methods mentioned above in which a patterned mask is typically first formed on the surface of the Si-containing substrate 12. The patterned mask can be formed prior to or after the ion implant step. Preferably, the patterned mask used to selectively form the areas of strained SiGe alloy 16 is formed prior to ion implantation.

Figure 7C:
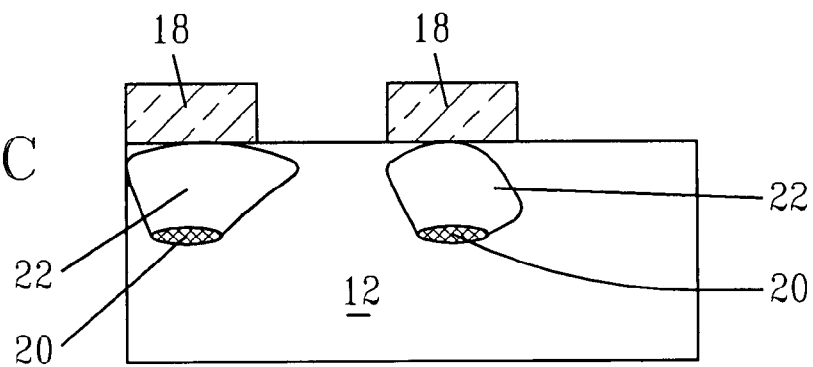

The structure containing the areas of selectively grown strained SiGe alloy 16 is then annealed, as described above in the first embodiment of the present invention, providing the structure shown in FIG. 7C. The structure illustrated in FIG. 7C, includes areas of substantially relaxed SiGe 18, platelets 20 and dislocation loops 22.

Figure 7D:
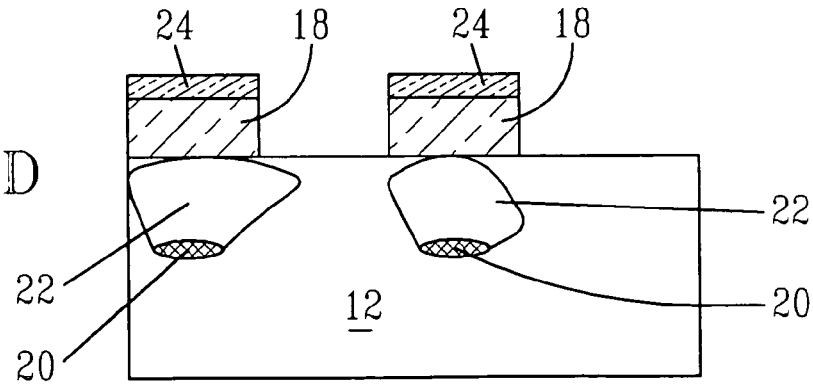

Next, and as shown in FIG. 7D, a strained semiconductor cap, preferably strained Si, 24 is selectively grown atop the areas of substantially relaxed SiGe alloy 18. The strained semiconductor cap 24 is formed utilizing one of the growth processes described above. A patterned mask can be used prior to the selective growth of the strained semiconductor cap 24. The patterned mask can be the same or different patterned mask as used in forming regions 14 or areas of strained SiGe alloy.

In any of the four embodiments mentioned above, one or more metal oxide semiconductor field effect transistors (MOSFETs) can be formed on the structure after annealing and growth of the semiconductor layer atop the substantially relaxed SiGe alloy. The MOSFETSs are formed utilizing conventional complementary metal oxide semiconductor (CMOS) processing that is well known in the art.

In the first embodiment, the entire structure has the same layered structure. Thus, it is desirable that the biaxial compressive strain in layer 24 be about 1% or greater, in order that the p-MOSFET performance is not degraded.

In the second embodiment, p-MOSFETs are fabricated atop the unstrained regions 56 of semiconductor layer 52, while n-MOSFETS are fabricating atop the strained regions 54 of semiconductor layer 52.

In the third embodiment of the present invention, p-MOSFETs are fabricated atop the areas of strained SiGe 16, while n-MOSFETs are fabricated atop the remaining areas of strained semiconductor 54.

In the fourth embodiment, the p-MOSFETs are fabricated on the substrate 12, while the n-MOSFETs are fabricated on the strained semiconductor layer 24.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a semiconductor structure comprising:
    forming at least one damaged region beneath a surface of a Si-containing substrate;
    forming a strained SiGe alloy on at least a portion of said surface of said Si-containing substrate containing said underlying at least one damaged region;
    annealing at a temperature of about 700° C. or above to cause substantial relaxation of the strained SiGe alloy via defect initiated strain relaxation, wherein during said annealing platelets and dislocation loops are formed that extend to the surface of the strained SiGe alloy; and
    forming a strained semiconductor cap on said strained SiGe alloy that has been substantially relaxed.

2. The method of claim 1 wherein said at least one damaged region is formed by ion implanting at least one atom selected from the group consisting of He, H, D, B and N.

3. The method of claim 2 wherein said at least one atom is He.

4. The method of claim 2 wherein said ion implanting comprises a maskless ion implantation process.

5. The method of claim 2 wherein said ion implanting comprises a masked ion implantation process.

6. The method of claim 2 wherein said at least one atom is implanted using a single implant step or multiple implant steps.

7. The method of claim 2 wherein said at least one atom is implanted at an ion dose from about $5 \times 10^{15}$ to about $2 \times 10^{16}$ cm$^{-2}$.

8. The method of claim 1 wherein said at least one damaged region is created from about 90 nm to about 300 nm below the surface of said Si-containing substrate.

9. The method of claim 1 wherein said strained SiGe alloy is formed by an epitaxial growth process.

10. The method of claim 9 wherein said epitaxial growth process is selected from the group consisting of ultra-high vacuum chemical vapor deposition (UHVCVD), rapid thermal chemical vapor deposition (RT CVD), chemical vapor deposition (CVD), molecular beam epitaxy (MBE), ion assisted deposition and chemical beam epitaxy.

11. The method of claim 10 wherein said epitaxial growth process is RT CVD.

12. The method of claim 1 wherein said strained SiGe alloy is present over the entire surface of said Si-containing substrate.

13. The method of claim 1 wherein said strained SiGe alloy is selectively grown.

14. The method of claim 1 wherein said strained SiGe alloy layer is a nearly pseudomorphic or strictly pseudomorphic $Si_{1-x}Ge_x$ composition in which x the mole fraction of Ge is uniform and is from about 0.01 to less than about 1.

15. The method of claim 1 wherein said strained SiGe alloy layer is a nearly pseudomorphic or strictly pseudomorphic $Si_{1-x}Ge_x$ composition that is graded wherein x increases from 0 at said surface of said Si-containing substrate to high values from about 0.01 to less than about 1 at upper region of the SiGe alloy.

16. The method of claim 1 wherein said annealing is performed in a non-oxidizing ambient.

17. The method of claim 1 wherein said temperature of annealing is from about 750° to about 900° C.

18. The method of claim 1 wherein said annealing is performed in a same reactor chamber as said forming said strained SiGe alloy.

19. The method of claim 18 wherein said forming said strained SiGe alloy, annealing and forming said strained semiconductor cap are performed in the same reactor chamber.

20. The method of claim 1 wherein said strained semiconductor cap comprises one of Si, SiGe, Ge, SiC or SiGeC.

21. The method of claim 20 wherein said strained semiconductor cap comprises a biaxial tensile strained Si layer.

22. The method of claim 20 wherein said strained semiconductor cap is formed by an epitaxial growth process.

23. The method of claim 1 wherein said forming said at least one damaged region comprises a masked ion implantation process so as to form at least one discrete and isolated damaged region with said substrate and said strained SiGe alloy is formed across the entire surface of said Si-containing substrate.

24. The method of claim 23 wherein during said annealing portions of the strained SiGe alloy that lay above the at least one discrete and isolated damaged region are relaxed, while other potions of the strained SiGe alloy that do not lay above said at least one discrete and isolated damaged region remain unchanged.

25. The method of claim 24 wherein during said forming said strained semiconductor cap the strained semiconductor is located on said substantially relaxed SiGe and unstrained semiconductor cap material is located above said strained SiGe alloy.

26. The method of claim 25 wherein said unstrained semiconductor cap material is removed.

27. The method of claim 1 wherein said forming said at least one damaged region comprises a masked ion implantation process so as to form at least one discrete and isolated damaged region with said substrate and said strained SiGe alloy is formed selectively on portions of said Si-containing substrate containing said at least one discrete and isolated damaged region.

28. The method of claim 1 further comprising forming at least one metal oxide semiconductor field effect transistor on said structure.

* * * * *